(12) United States Patent
McCormick et al.

(10) Patent No.: US 8,173,453 B2
(45) Date of Patent: May 8, 2012

(54) LASER PATTERNING OF ENCAPSULATED ORGANIC LIGHT EMITTING DIODES

(75) Inventors: Fred B. McCormick, Maplewood, MN (US); Robert C. Fitzer, North Oaks, MN (US); Hung T. Tran, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 96 days.

(21) Appl. No.: 11/970,268

(22) Filed: Jan. 7, 2008

(65) Prior Publication Data

US 2008/0160789 A1 Jul. 3, 2008

Related U.S. Application Data

(62) Division of application No. 10/326,297, filed on Dec. 19, 2002, now Pat. No. 7,338,820.

(51) Int. Cl.
*H01L 21/00* (2006.01)

(52) U.S. Cl. ...... 438/26; 438/99; 438/795; 257/E21.001

(58) Field of Classification Search ............ 438/25, 438/26, 99, 795; 257/E21.001
See application file for complete search history.

(56) References Cited

U.S. PATENT DOCUMENTS

| | | | |
|---|---|---|---|
| 5,707,745 A | 1/1998 | Forrest et al. | |
| 5,734,154 A | 3/1998 | Jachimowicz et al. | |
| 5,814,417 A | 9/1998 | Nagayama | |
| 5,882,949 A * | 3/1999 | Okazaki | 438/26 |
| 6,037,190 A | 3/2000 | Chao et al. | |
| 6,060,826 A | 5/2000 | Ueda et al. | |
| 6,114,183 A | 9/2000 | Hamada et al. | |
| 6,134,180 A | 10/2000 | Kim et al. | |
| 6,136,622 A | 10/2000 | Fukuzawa et al. | |
| 6,146,715 A | 11/2000 | Kim et al. | |
| 6,163,313 A | 12/2000 | Aroyan et al. | |
| 6,379,509 B2 | 4/2002 | Choi et al. | |
| 6,396,616 B1 | 5/2002 | Fitzer et al. | |
| 6,399,226 B1 | 6/2002 | Kitaguchi et al. | |
| 6,399,258 B2 | 6/2002 | O'Brien et al. | |
| 6,434,180 B1 | 8/2002 | Cunningham | |
| 6,489,174 B1 * | 12/2002 | Tseng et al. | 438/29 |
| 6,506,616 B1 | 1/2003 | Kim et al. | |
| 6,549,193 B1 | 4/2003 | Huang et al. | |
| 6,566,156 B1 * | 5/2003 | Sturm et al. | 438/35 |
| 6,603,141 B2 * | 8/2003 | Lach et al. | 257/40 |
| 6,644,111 B2 | 11/2003 | Cytron et al. | |
| 6,730,934 B2 * | 5/2004 | Yamada et al. | 257/79 |
| 6,797,920 B2 | 9/2004 | Kitaguchi et al. | |
| 6,846,579 B2 | 1/2005 | Anderson et al. | |

(Continued)

FOREIGN PATENT DOCUMENTS

EP 1 021 070 A1 7/2000

(Continued)

OTHER PUBLICATIONS

Tada et al., "Patterned emission from polymeric light-emitting device realized by photo-irradiation in air," Thin Solid Films 363, Elsevier Science S.A., 2000, p. 195-197.

(Continued)

*Primary Examiner* — Kimberly Nguyen
*Assistant Examiner* — Duy Nguyen

(57) ABSTRACT

Patterning an organic light emitting diode (OLED) after it has been encapsulated by permanently changing the light emissivity of the diodes. The OLED includes an intervening layer between a source of laser treatment and a light emitting layer. Depending on the composition of the light emitting layer, the laser treatment will enhance or diminish brightness.

19 Claims, 2 Drawing Sheets

U.S. PATENT DOCUMENTS

| | | |
|---|---|---|
| 6,879,319 B2 | 4/2005 | Cok |
| 7,153,592 B2 | 12/2006 | Yoshikawa |
| 7,234,984 B2 | 6/2007 | Nishikawa et al. |
| 2001/0028343 A1 | 10/2001 | Bottari et al. |
| 2002/0003403 A1* | 1/2002 | Ghosh et al. ............... 313/512 |
| 2002/0006040 A1* | 1/2002 | Kamada et al. ............. 362/237 |
| 2003/0064540 A1* | 4/2003 | Auch et al. ................... 438/99 |
| 2004/0004433 A1 | 1/2004 | Lamansky et al. |

FOREIGN PATENT DOCUMENTS

| | | |
|---|---|---|
| EP | 1 043 915 A1 | 10/2000 |
| EP | 1 047 119 A2 | 10/2000 |
| JP | 8-222371 | 8/1996 |
| JP | 9-306666 | 11/1997 |
| JP | 9-320760 | 12/1997 |
| JP | 2001-23774 | 1/2001 |
| JP | 2001-76870 | 3/2001 |
| JP | 02/07235 A1 | 1/2002 |
| JP | 2003-233329 | 8/2003 |
| JP | 2003-272845 | 9/2003 |
| WO | 98/53510 | 11/1998 |
| WO | 00/70655 | 11/2000 |
| WO | 01/41512 A1 | 6/2001 |

OTHER PUBLICATIONS

Colle et al., "Patterning of organic light-emitting diodes containing a layer of perylene derivative using an He-Ne laser," Synthetic Metals 111-112, Elsevier Science S.A., 2000, p. 95-97.

Tada et al., "Photoinduced modification of photoluminescent and electroluminescent properties in poly(p-phenylene vinylene) derivative," Journal of Applied Physics, vol. 86, No. 6, 1999, p. 3134-3139.

The Theory of the Photographic Process, $4^{th}$ Ed., Macmillian Publishing Co., Inc., 1977, Chapter 19, Section II.B, Colorimetry, p. 563-565.

Chen et al., "Recent Developments in Molecular Organic Electroluminescent Materials," Organic Light-Emitting Materials and Devices, Macromolecular Symposia, Huthig & Wepf Verlag, Zug, Oxford, CT., 1997, 125, p. 1-48.

Zhou et al., "Very-low-operating-voltage light-emitting diodes using a p-doped amorphous hole injection layer," Applied Physics Letters, vol. 78, No. 4, Jan. 22, 2001, p. 410-412.

Shen et al., Three-Color, Tunable, Organic Light-Emitting Devices, Science, vol. 276, No. 5321, p. 2009-2011.

Halls et al., "Light-emitting and photoconductive diodes fabricated with conjugated polymers," Thin solid Films 276, Elsevier Science S.A., 1996, p. 13-20.

Wyszecki et al., "Colorimetry," Color Science Concepts and Methods, Quantitative Data and Formulae, $2^{nd}$ Ed., John Wiley & Sons, 1982, Chapter 3, p. 117-143.

Kido, Junji, "Organic Electroluminescent Devices Based on Polymeric Materials," Trends in Polymer Science, Elsevier Science Ltd., Cambridge, UK, 1994, vol. 2, p. 350-355.

* cited by examiner

US 8,173,453 B2

LASER PATTERNING OF ENCAPSULATED ORGANIC LIGHT EMITTING DIODES

CROSS REFERENCE TO RELATED APPLICATIONS

This application is a divisional of U.S. Ser. No. 10/326,297, filed Dec. 19, 2002, now U.S. Pat. No. 7,338,820, the disclosure of which is incorporated by reference in its entirety herein.

TECHNICAL FIELD

This invention relates to methods of laser patterning organic light emitting diodes by permanently changing the light emissivity of the diodes.

BACKGROUND

Organic light emitting diodes (OLEDs), sometimes referred to as lamps, are desirable for use in electronic media because of their thin profile, low weight, capability of producing a wide variety of emission colors, and low driving voltage. OLEDs have potential use in applications such as backlighting of graphics, pixelated displays, and large emissive graphics.

OLEDs typically consist of an emissive organic element sandwiched between two electrodes: a cathode and an anode. The emissive organic element may be a single layer or it may be a multilayer. The emissive element must be capable of electron transport and hole transport as well as light emission. Charge carriers, i.e., electrons and holes, are injected into the emissive element from the cathode and anode, respectively. Electrons are negatively charged atomic particles and holes are vacant electron energy states that behave as though they are positively charged particles. The charge carriers migrate towards the center of the emissive element where they combine to emit light.

FIG. 1 exemplifies the structure of a typical OLED device that may be used in the present invention. Device 10 comprises substrate 12 on which are located cathode pad 14 and anode 16, which are separated by a space. Organic emitter layer 18 is located on top of anode 16. Cathode 20 is located over emitter layer 18 and in physical contact with cathode pad 14. Encapsulating means, such as encapsulating adhesive 22 and encapsulating lid 24, protect the device from contamination.

The emissive element may be a molecularly doped polymer where charge carrying and/or emitting species are dispersed in a polymer matrix (see J. Kido, "Organic Electroluminescent devices Based on Polymeric Materials," Trends in Polymer Science, 1994, 2, 350-355), a conjugated polymer where layers of polymers such as poly(phenylenevinylene) act as the charge carrying and emitting species (see J. J. M. Halls, D. R. Baigent, F. Cacialli, N. C. Greenham, R. H. Friend, S. C. Moratti, and A. B. Holmes, "Light-emitting and Photoconductive Diodes Fabricated with Conjugated Polymers," Thin Solid Films, 1996, 276, 13-20), a vapor deposited small molecule heterostructure (see C. H. Chen, J. Shi, and C. W. Tang, "Recent Developments in Molecular Organic Electroluminescent Materials," Macromolecular Symposia, 1997, 125, 1-48), or various combinations of these elements.

OLEDs generally require some level of patterning to be of practical use. This could be as simple as patterning the anode and/or cathode into a simple shape, such as a rectangle, for use as a backlight or as complex as a multitude of small pixels, each composed of red, green, and blue subpixels, for a full-color, high-resolution display.

Transparent anodes may be patterned by etching away portions of the conductive anode material with acid through a photoresist mask. Alternatively, insulating coatings, such as alumina, may be applied to the anode through a shadow mask to create a patterned anode. Metal cathodes are typically patterned by vapor deposition of the metal through a shadow mask placed onto the device being fabricated. The organic layers may be patterned by, for example, evaporation through a shadow mask, ink jet printing, or laser-induced thermal imaging (LITI). All of the typical patterning techniques currently in use for OLEDs must be done prior to or during the device fabrication and before the device is encapsulated. Thus there are special handling requirements, such as high vacuums and inert atmospheres, for these patterning techniques that preclude their use outside of a sophisticated OLED fabrication facility.

Transparent graphics could be applied to an OLED device to create a patterned emissive element after device fabrication and packaging. However, such an emissive element could suffer from parallax and would generally be less power efficient since portions of the light generated by the device would be blocked by the graphic overlay.

SUMMARY

At least one aspect of the present invention features a novel method for patterning an OLED after it has been encapsulated. The method involves treating the OLED's light emitting layer with a laser. Depending on the composition of the light emitting layer, the laser treatment will enhance or diminish brightness.

One embodiment of the present invention comprises a method for laser patterning encapsulated organic light emitting diodes comprising providing an encapsulated organic light emitting diode having a light emitting layer, treating one or more areas of the light emitting layer with a laser beam, which laser beam energy is transmitted through an electrode layer, wherein the energy level of the laser beam is below the ablation threshold of the light emitting layer and any intervening layers, and wherein the light emission of the area(s) of the light emitting layer treated with the laser beam are permanently changed.

As used in this invention:

"change in color" means a shift in the X and/or Y coordinates on a CIE color coordination chart;

"change in brightness" means a change in candelas/meter$^2$ (cd/m$^2$);

"encapsulated" means sealed inside a hermetic or near-hermetic packaging system that provides protection from the ambient atmosphere; and "intervening layer" means any layer of an OLED between the laser source and the light emissive layer.

An advantage of at least one embodiment of the present invention is that the brightness or color of the OLED can be altered after the OLED is constructed. This allows a hermetically sealed device to be constructed in a contaminant-free environment, then modified without exposure to contaminants.

Another advantage of at least one embodiment of the present invention is that it provides a simplified packaging and manufacturing method.

Another advantage of at least one embodiment of the present invention is that it allows for patterning outside of a clean room.

Another advantage of at least one embodiment of the present invention is that it makes customized products and short manufacturing runs economically feasible.

Another advantage of at least one embodiment of the present invention is that it can be done via digital imaging, can be done without a mask, and can be done quickly.

Another advantage of at least one embodiment of the present invention is that multiple exposures can be performed.

Another advantage of at least one embodiment of the present invention is that variable data can be added at a later date.

Other features and advantages of the invention will be apparent from the following drawings, detailed description, and claims.

DETAILED DESCRIPTION

Figure 1:
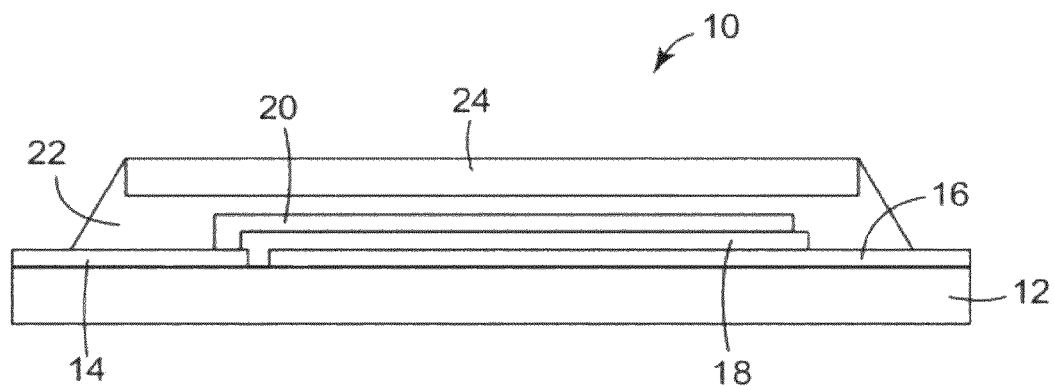
FIG. 1 depicts a typical OLED structure.

The present invention provides the permanent alteration of the brightness and/or color of the light emitting layer of an OLED by laser treatment. Whether the brightness is enhanced or diminished depends on the type of material comprising the light emitting layer. Laser treatment of a light emitting polymer (LEP) layer tends to enhance its brightness. A light emitting polymer (LEP) device comprises light-emitting conjugated polymers. Laser treatment of a small molecule or molecularly-doped polymer (MDP) material tends to diminish its brightness. Small molecule (SM) devices typically comprise a number of functional organic layers incorporating relatively low molecular weight charge transport materials and emissive dopants. Molecularly-doped devices typically comprise a charge transport matrix comprising at least one polymeric material and non-polymeric emissive and/or charge transporting dopants. Positive and negative images may be formed in these devices depending on which areas are subjected to laser treatment and the nature of the digital imaging (that is, positive versus negative).

The present invention provides a commercially viable way to provide imaged encapsulated OLEDs. Encapsulated OLEDs can be patterned using a low cost, small, and low power laser diode imaging system. The ability to pattern the device after encapsulation allows the production and sale of pre-made, stable OLED panels that a customer can pattern to its specifications. These products may be particularly well suited to low-end, possibly disposable, products such as emissive labels, novelty items, and temporary signage. Post-encapsulation patterning could also be important in high-resolution displays as, for example, in making touch panels and touch screen panels, such as those described in U.S. Pat. App. 2001/0028343 and as a method to improve pixel size uniformity, edge definition, and brightness. The methods of the present invention may also be used on unencapsulated OLEDs, but is of particular value because it can be performed on encapsulated diodes.

Laser imaging systems are commonly used to produce photographic or electrophotographic images from image data generated by computer-controlled or microprocessor-based scanner systems. The digital image data is a sequence of digital images values representative of the scanned image, image processing electronics within an image management subsystem, and image data values to generate a sequence of digital laser drive values (e.g., exposure values), which are input into the laser scanner. The laser scanner is responsive to the digital laser drive values for scanning across the photosensitive film or other receptive substrate in a raster pattern. An imaging system uses laser beam scanning techniques that repetitively expose successive raster line or scan lines across a receptor sheet. The scan lines extend across the entire sheet. The lines are imaged at a constant speed and stepped incrementally down the sheet after each scan is completed. During the scanning process the laser beam is pulsed at discrete incremental power levels between on and off, depending on the digital laser drive value commands from the bit stream. The result of this process is an image that is made up of a population of ordered pixels, which have X and Y addresses. These pixels have their own individual brightness depending on the XY address as it relates to the bit stream data.

"Pixel" means the smallest picture element of a digital graphic image. A pixel may be either 1) a discrete emissive element physically separated from the surrounding elements that is created by electrode patterning such as in a passive matrix display consisting of rows of anodes and columns of cathodes whereby light emission only occurs at the intersection of said electrodes or 2) an emissive area within an emissive element that is not physically separated from the surrounding emissive areas (i.e., they share the same cathode and anode) but may have different emissive characteristics such as different colors or brightness. For example, a digital image that contains 500 contiguous dots per inch in both the X and Y directions would have a pixel size of 50 microns by 50 microns and would contain 250,000 pixel locations in a square inch.

In the present invention, the emissive layer is typically exposed to a laser through the anode side of the device. The amount of laser power delivered to the areas to be imaged should be in a range that can penetrate the substrate, anode, and any other intervening layer, and alter the emissivity of the light-emitting element. However, the laser power should not be strong enough to ablate any of the layers in the OLED. If this occurs, for example if the laser ablates or destroys the emissive element and possibly the cathode layer, short circuits can be created that render the device inoperable. The emissive layer may also be exposed to a laser through the cathode side of a device.

Lasers useful in this invention can be classified into three general categories. They can be solid state (crystal), gas or semiconductor lasers. All of these devices create and amplify a narrow, intense beam of coherent light. Although light from any laser source is useful in this invention the preferred class of lasers for the invention are semiconductor lasers. Included in the category of semiconductor lasers are vertical-cavity surface-emitting lasers (VCSELs) as exemplified in U.S. Pat. No. 6,434,180 and quantum cascade devices as exemplified in U.S. Pat. No. 6,134,180.

The amount of laser power delivered to the device can be controlled in a number of ways. Variables that can be controlled include the laser drive current, laser scanner speed, and the depth (position) offset from the laser beam focal point. Laser power, speed, and the absorptivity of the materials in the device are interactive. For example, the amount of power needed to image a layer depends on the material of the device, including whether or not it contains filler(s) that change the power requirements and the depth of the material being imaged.

The emissive element of an OLED may consist of a number of discrete layers or a single layer. The layers may be formed by techniques such as vapor deposition or solution coating. If vapor deposition is used, a single layer can be obtained by vapor deposition of a single material. Alternatively, a single layer containing several materials may be made by co-evaporating the various components of the layer at the same time. Single layers may be of uniform composition or of a gradient composition such that there are no discrete interfaces. This can be achieved by changing the ratio of two or more components during the deposition of the single layer. Multi-layered devices can be obtained by sequential vapor deposition of the various components.

In solution coated devices, a single layer is readily formed by dissolving the various components in a suitable coating solvent and casting the film by any of the known methods such as spin coating, gravure coating, knife coating ink-jet printing, screen printing, and the like. Multilayer coatings can be prepared by dissolving the various components in separate solvents and casting the films sequentially. Care must be taken to prevent subsequent coatings from destroying previously coated layers. This may be accomplished, for example, by using coating solvents in the layer being applied that are non-solvents for the layer previously deposited. Alternatively, a previously applied layer can be made insoluble in the coating solvent by, for example, crosslinking or thermally converting a soluble precursor polymer to an insoluble polymer. Small molecule emissive layers are typically formed by vapor deposition or solution coating with vapor deposition being the most common approach. LEP and MDP emissive layers are generally formed by solution coating techniques.

In small molecule devices, suitable small molecule materials include hole transport materials, electron transport materials, fluorescent emissive materials, phosphorescent emissive materials, and hole blocking materials.

Examples of suitable hole-transporting materials include N,N'-bis(3-methylphenyl)-N,N'-bis(phenyl)benzidine (TPD), N,N'-bis(3-naphthalen-2-yl)-N,N'-bis(phenyl)benzidine (NPD), 4,4',4"-tris(N,N-diphenylamino)triphenylamine (TDATA), 4,4',4"-tris(N-3-methylphenyl-N-phenylamino) triphenylamine (MTDATA), 4,4',4"-tri(N-phenothiazinyl) triphenylamine (TPTTA), 4,4',4"-tri(N-phenoxazinyl) triphenylamine (TPOTA), 4,4'-bis(carbazol-9-yl)biphenyl (CBP).

Examples of suitable electron-transporting materials include tris(8-hydroxyquinolinolato)aluminum (AlQ), 3-(4-biphenylyl)-4-phenyl-5-(4-tert-butylphenyl)-1,2,4-triazole (TAZ), 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD), 1,3-bis[5-(4-t-butylphenyl)-1,3,4-oxadiazol-2-yl]benzene (PBD dimer), 1,3,5-tris(5-(p-octyloxyphenyl)-1,3,4-oxadiazol-2-yl)benzene (OPOB), and 2,5-bis(1-naphthyl)-1,3,4-oxadiazole (BND), biphenylatobis(2-methyl-8-hydroxyquinolinolato)aluminum (BAlq), 9,10-bis(2-naphthyl)anthracene (ADN).

Examples of suitable fluorescent emissive materials include 10-(2-benzothiazolyl)-2,3,6,7-tetrahydro-1,1,7,7-tetramethyl-1H,5H, 11H-[1]benzopyrano[6,7,8-i,j]quinolizin-11-one (Coumarin C545T), 3-(2-benzothiazolyl)-7-diethylaminocoumarin (Coumarin 6 or Coumarin 540), 2,5,8,11-tetra-t-butylperylene (TBP), 4,4'-bis(2,2-diphenylvinyl) biphenyl (DPVBi), 5,6,11,12-tetraphenylnaphthacene (rubrene), 4-(dicyanomethylene)-2-t-butyl-6-(1,1,7,7-tetramethyljulolidyl-9-enyl)-4H-pyran (DCJTB), bis(8-quinolinolato) zinc(II), bis(2-(2-hydroxyphenyl)benzoxazolate) zinc(II), bis(2-(2-hydroxyphenyl)benzothiazolate) zinc(II), bis(2-(2-hydroxyphenyl)-5-phenyl-1,3,4-oxadiazole) zinc (II), tris(8-hydroxyquinolinolato)aluminum (AlQ), and biphenylatobis(2-methyl-8-hydroxyquinolinolato)aluminum (BAlq).

Examples of suitable phosphorescent emissive materials include cyclometallated chelate complexes of Ir(III), Rh(III), Os(II), Ru(II), and Pt(II) include molecules derived from phosphorescent organometallic $L^1{}_3Ir$ (III), $L^1{}_3Rh$ (III), $L^1L^2Ir(III)$ X, $L^1L^2Rh(III)$ X, $L^1L^2Os(II)$ Y, $L^1L^2Ru(II)$ Y, $L^1L^2Pt(II)$ compounds where $L^1$ and $L^2$ can be the same or different in each instance and are optionally substituted cyclometallated bidentate ligands of 2-(1-naphthyl)benzoxazole, 2-phenylbenzoxazole, 2-phenylbenzothiazole, 2-phenylbenzimidazole, 7,8-benzoquinoline, coumarin, phenylpyridine, benzothienylpyridine, 3-methoxy-2-phenylpyridine, thienylpyridine, tolylpyridine; X is selected from the group consisting of acetylacetonate (acac), hexafluoroacetylacetonate, salicylidene, picolinate, and 8-hydroxyquinolinate; and Y is selected from charge neutral chelating compounds such as optionally substituted derivatives of phenathroline or bipyridine. Useful cyclometallated Ir(III) chelate derivatives include those described in WO 0070655 and WO 0141512, and useful cylcometallated Os(II) chelate derivatives include those described in U.S. patent application Ser. No. 09/935, 183 filed Aug. 22, 2001. Platinum(II) porphyrins such as octaethyl porphyrin (also known as Pt(OEP)) are also useful.

Examples of suitable hole blocking materials include 2,9-dimethyl-4,7-diphenyl-1,10-phenanthroline (BCP), 1,3,5-tri (phenyl-2-benzimidazolyl)benzene (TPBI).

Molecularly doped polymer (MDP) materials consist of soluble small molecule charge transporters and emitters dispersed in a polymer binder. The binder may be electrically inert (i.e., inactive with respect to OLED operation) or electrically active (i.e., is charge transporting and/or emitting during OLED operation). Inert binders include polystyrene, polyesters, polycarbonates, polyacrylates, polymethacrylates, and polyolefins. Active binders include LEPs, polyvinylcarbazole, polyoxadiazoles, and polyarylamines such as poly[N-(3-methylphenyl)-N,N-diphenylamine-4,4'-diyl].

The soluble charge transporters and emitters include the vapor desositable materials listed above as well as materials less suited for vapor deposition such as oligomers or ionic salts In light emitting polymer (LEP) devices, suitable materials include polyphenylenevinylenes (PPVs), polyfluorenes (PFs), polyparaphenylenes (PPPs), polyphenylenealkynelenes, polythiophenes, and their copolymers. Copolymers and blends of these materials with non-active materials such as polyesters, polycarbonates, polyacrylates, polymethacrylates, polyolefins, and the like are also useful. Representative LEPs include poly[(9,9-dioctylfluoren-2,7-diyl, poly[(9,9-dihexylfluoren-2,7-diyl)-alt-co-(1,4-dimethylbenzen-2,5-diyl)], poly[2-Methoxy-5-(2'-ethylhexyloxy)-1,4-phenylenevinylene], poly[(9,9-dihexylfluoren-2,7-diyl)-alt-co-(benzo[2,1,3]thiadiazol-4,7-diyl)], poly[(9,9-Dihexylfluoren-2,7-diyl)-co-(anthracen-9,10-diyl)], poly[(9,9-dioctylfluoren-2,7-diyl)-co-(ethylynylbenzene)], poly[2-(6-Cyano-6-methylheptyloxy)-1,4-phenylene], and PD 132 (Super Yellow from Covion).

Hybrid, or combination, devices may also be used in the present invention. These devices may incorporate two or more of small molecule, molecularly-doped, and LEP materials. The images obtained by laser treatment will depend on the materials used, the structure of the hybrid device, and the areas or layers that are treated with the laser.

Per the present invention, laser treatment of an OLED device causes a change in electroluminescence. Laser treatment of a small molecule device or a molecularly-doped polymer device per the present invention tends to destroy or diminish electroluminescence (i.e., brightness) of the emissive element. Laser treatment of a light emitting polymer device per the present invention tends to enhance electroluminescence (i.e., brightness) of the emissive element.

Grayscale images are composed of areas with different levels of brightness (i.e., cd/m$^2$). The resolution of a grayscale graphic image depends on the size of the areas of different brightness and the number of brightness levels that can be obtained. An image formed with, for example, areas capable of 100%, 50%, or 0% brightness (essentially a minimal grayscale level) will be of greater resolution than an image formed from areas that are either on (100% brightness) or off (0% brightness). Thus the greater the grayscale range, the better the resolution of the graphic image.

The laser patterning of this invention is capable of providing grayscale images. By exposing small molecule OLEDs to low laser powers, it is possible to dim the electroluminescence in the exposed area rather than eliminate it completely thereby giving rise to a grayscale image. Similarly, for LEP OLEDs, which brighten in the laser exposed areas, the degree of brightness enhancement can be controlled by varying the laser power delivered to the device thereby giving rise to a grayscale image.

The laser treatments of the present invention are also well-suited for altering the emissivity of individual pixels in a pixilated display. Being able to alter the emissivity of individual pixels could be advantageous for providing uniform emissivity. The laser treatment could also allow the emission colors of individual pixels to be altered. This could be accomplished, for example, by doping pixels with dyes that change color upon exposure to a laser beam. Suitable dyes include those that absorb in the infrared region. Examples of suitable dyes are described in Chemistry and Applications of Leuco Dyes, (Ramaiah Muthyala, Editor) (Plenum Press, 1997, New York).

Dyes sensitive to the frequency of the laser imager (i.e., change color upon exposure) may be added to the OLED to effect specific color changes upon laser imaging. These may be placed in any of the organic layers provided they do not interfere with the functionality of the OLED. In particular, organic dyes may be incorporated into the organic solvent electron acceptor doped arylamine buffer layers described in co-pending application U.S. Ser. No. 10/183,717("Buffer Layers for Organic Electroluminescent Devices and Methods of Manufacture and Use," S. Lamansky, et al. filed Jun. 26, 2002) to affect the color of the light emitted by the device. Incorporation of laser sensitive dyes into these buffer layers provide the ability to vary the emissive color of the device in selected areas without effecting the operational characteristics of the emissive element. This can be accomplished by controlling the focus and depth of field of the laser such that only the buffer layer received sufficient energy to cause the desired color changes. Furthermore, control of focus and depth of field allows for the selective laser exposure of different layers within the OLED. Thus in a "stacked" device containing separate red, green, and, blue emissive layers such as that described in U.S. Pat. No. 5,707,745 and Z. Shen, P. E. Burrows, V. Bulovic, S. R. Forrest, and M. E. Thompson, "Three-Color, Tunable, Organic Light-Emitting Devices," Science, 1997, 276, 2009-2011. The red, green, and blue layers could be selectively exposed to create a full color graphic image. If the RGB stacked device was fabricated on a pixelated substrate (active or passive matrix), the individual pixels could be imaged with appropriate focus and depth of field to create an addressable full color display consisting of RGB sub-pixels. Thus the need to deposit the RGB emissive elements on specific sub-pixels during device fabrication by difficult and expensive patterning techniques, such as shadow masking or ink-jet printing, is eliminated.

The color of an OLED display or lamp is often described in terms of the X and Y coordinates in the 1931 C.I.E. chromaticity diagram. A full explanation of the 1931 C.I.E. chromaticity diagram is provided by Wyszecki and Stiles, Color Science, Concepts and Methods: Quantitative Data and Formulae, 2nd Ed., Chapter 3, Colorimetry, Wiley, 1982, pp. 117-143, and a more succinct explanation is provided by James, The Theory of the Photographic Process, 4th Ed., Macmillan, 1977, Chapter 19, II, B, Colorimetry, pp. 563-565. In essence, fully saturated monochromatic hues ranging from 380 to 770 nm form a curve defining the saturation boundaries of the visible spectrum. Hues that lie within the curve boundary are to some extent desaturated, meaning that they tend more towards white. The X and Y axes are employed as descriptors for precisely locating each visible hue. For example, an OLED lamp with a C.I.E. X=0.63 and Y=0.37 would correspond to a device emitting red light, a C.I.E. X=0.31 and Y=0.63 would correspond to a device emitting green light, a C.I.E. X=0.15 and Y=0.17 would correspond to a device emitting blue light, and a C.I.E. X=0.33 and Y=0.33 would correspond to a device emitting white light. Thus, "change in color" means a shift in the X or Y coordinates in the 1931 C.I.E. chromaticity diagram.

EXAMPLES

This invention may be illustrated by way of the following examples.

Test Methods

Laser Imaging Results. The laser imaging test bed used in this study is fully described in U.S. Pat. No. 6,396,616. The imaging head contains a 4 watt laser diode emitting 925 nm light. The imager has an apparent laser spot size of 50×50 microns and delivered about 1,000 mJ/cm$^2$ under the conditions used in this study. The projected images are bit-mapped format (.BMP) graphic files. As described in the examples below, the emissive patterns can be created in an encapsulated OLED by exposing it to IR laser light through the front of the device (as shown in FIG. 1) using the laser imager.

Example 1

Encapsulated Small Molecule Device

Figure 2:
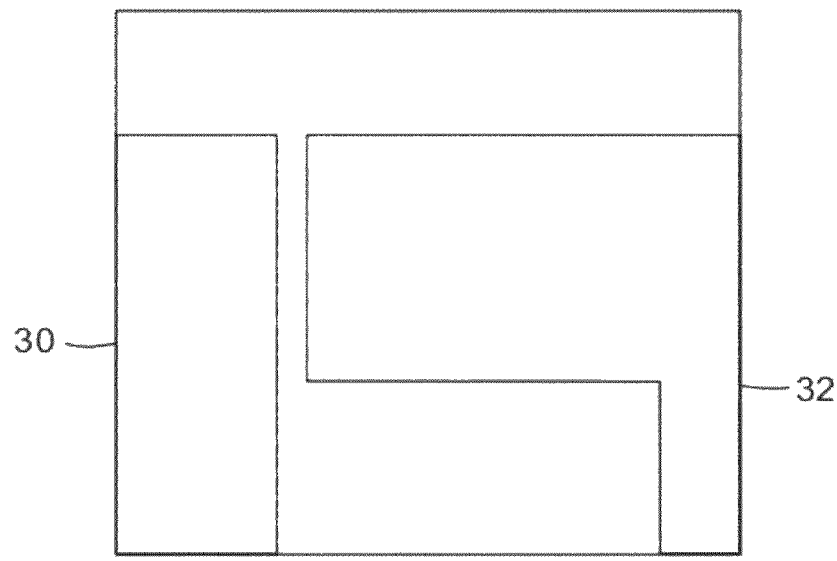
FIG. 2 depicts the anode and cathode pad shapes for the OLED of Example 1.

Several encapsulated organic light-emitting diodes (OLEDs) were prepared on 22 mm square (1-1.1 mm thick) indium-tin oxide (ITO) coated glass (15 ohm/square, Colorado Concept Coatings LLC, Longmont, Colo.). The ITO was etched in an HCl/FeCl$_3$ etching solution (3.2 g FeCl$_3$ in 100 mL concentrated HCl) using SCOTCH Brand solder plating tape (Product No. 1280, 3M Company, St. Paul, Minn.) as the etching mask to create a cathode pad and an anode pad. A 4×22 mm portion of the ITO along the top edge of the substrate was etched away. A 8×15 mm portion of the ITO along the bottom edge of the substrate was etched away. A 1×10 mm portion of the ITO connecting these two areas was etched away leaving a 5×18 mm ITO cathode pad 30 along the left edge of the substrate and a flag-shaped ITO anode pad 32 consisting of a 10×16 mm portion extending from the right side of the substrate connected to a 2×8 mm portion extending along the lower right side of the substrate. The anode and cathode pads are separated by a 1 mm gap. The approximate shapes of the anode and cathode pads are illustrated in FIG. 2. The substrates were cleaned by rubbing with a methanol soaked lint-free cloth (Vectra Alpha 10, Texwipe Co., LLC, Upper Saddle River, N.J.) followed by a 4 minute oxygen plasma treatment, at 50 watts and 200 millitorr oxygen, in a plasma chamber (Micro-RIE Series 80, Technics, Inc., Dublin, Calif.). An aqueous solution of polypyrrole (5 wt % solids solution from Aldrich, Milwaukee, Wis. diluted with an equal volume of distilled water) was spin coated at 2500 rpm to give a 50 nm thick film. Polypyrrole was removed from the cathode pad by wiping with a moist cotton swab and the samples were dried for 15 minutes at 110° C. under nitrogen. The samples were placed in a bell jar vacuum evaporator and 400 Å N,N'-bis(3-naphthalen-2-yl)-N,N'-bis(phenyl)benzidine (NPD) (H.W. Sands Corp., Jupiter, Fla.), 200 Å aluminum tris(8-hydroxyquinolate) (AlQ) (H.W. Sands Corp, Jupiter, Fla.) doped with 1% (10-(2-benzothiazolyl)-2,3,6,7-tetrahydro-1,1,7,7,-tetramethyl 1-1H,5H, 11H-[1]benzopyrano[6,7,8-ij]quinolizin-11-one (545T dye) (Eastman Kodak Co., Rochester, N.Y.) 10 Å LiF (Alfa Aesar Co., Ward Hill, Mass., and 2000 Å Al Alfa Aesar Co., Ward Hill, Mass.) were sequentially thermally evaporated through a 2 mm thick aluminum metal mask containing 12×16 mm openings. 1 mm thick metal bars were attached on the side of the mask facing the deposition sources so that approximately 1 mm of the mask openings over the cathode pads were covered. The organics (NPD, C545T, and AlQ) and cathode materials (LiF and Al) were deposited from opposite angles. Due to the shadowing effects of the thick deposition mask and metal bar arrangement, the LiF/Al cathode could make good contact to the cathode pad with no interference from the organic layers. All the layers were deposited in a single pump-down without the need for a mask change between the organic and cathode layers. The ITO etch pattern, angle evaporation, and shadowing from the thick mask construction prevented short circuit formation at the periphery of the deposition area.

The devices were encapsulated in a nitrogen atmosphere glove box by placing a drop of UV epoxy adhesive (EpoTek OG142-13, Epoxy Technology, Billerica, Mass.) onto the cathode, placing a 18 mm square glass cover slip over the adhesive drop, allowing the adhesive to flow until the area under the cover slip was filled with adhesive and the cover slip completely covered the cathode area, and irradiating the device for 20 minutes with a lamp (Blak-Ray Model XX-15, UVP, Inc., San Gabriel, Calif.) containing two 15 watt fluorescent black light bulbs (F15T8-BLB, General Electric, Scenectady, N.Y.) from a distance of 20 mm. The resulting OLED devices were thereby protected from air. The devices had ITO anode and cathode leads that extended beyond the encapsulated area and allowed electrical connection to drive the device. The cover slips were about 0.15 mm thick. The total thickness of the encapsulated OLEDs was about 1.4 mm.

The devices in Table I were exposed to IR laser light using the imager described in U.S. Pat. No. 6,396,616 B1. The laser system used a single 4 watt diode laser source (SDL-6800 series laser diode, JDS Uniphase of San Jose, Calif.) which was designed to emit light with a 50 micron width. The diode laser was designed to emit 4 watts of optical power at a drive current of 4.96 amps and 1.7 volts. The optical output had a wavelength of 920 nm. The laser system was also fitted with a fiber lens (Blue Sky, San Jose, Calif.) to correct for optical astigmatism. Bit-mapped graphic images were scanned at 500 dots/2.54 cm through the anode side of the devices with a laser imaging head. The imaging head moved in the x direction (between 5 mm to 15 mm per second) and the imaging table moved in the y direction to fully image the approximately 12×14 mm emissive area of the OLED devices. The focal point of the laser system could be varied by changing the distance between the imaging head and the imaging platform (z direction). The imaging head was set to be 1400 microns above the imaging table in order to place the OLED stack in the focus of the laser beam.

TABLE I

Samples Exposed to IR Laser Light

| Sample | Scanner Rpm | Laser drive current mA (milliamps) | Scanned Bit-map Graphic |
|---|---|---|---|
| 1 | 3000 | 6000 | Focus Lines |
| 2 | 2500 | 6000 | Focus Lines |
| 3 | 2350 | 7000 | Focus Lines |
| 4 | 2350 | 7000 | AC Adapter Label |
| 5 | 2000 | 7000 | AC Adapter Label |
| 6 | 1750 | 8000 | AC Adapter Label |
| 7 | 1500 | 8000 | AC Adapter Label |
| 8 | 1250 | 8000 | AC Adapter Label |

In all cases, a negative image of the bit-mapped graphic was visible when a DC voltage of about 4-6 volts and above was applied to the devices in the forward direction. The electroluminescence was decreased or eliminated or showed a shift in the emitted color from green to blue-green in the areas that were exposed to the laser. The electroluminescence of the unexposed regions before and after the imaging process appeared to be virtually unchanged to the naked eye.

This example shows that detailed patterns can be written into encapsulated OLEDs using an IR diode laser and that a variety of imaging conditions are effective.

Example 2

Encapsulated Small Molecule Device

A set of OLED devices on 22 mm glass were fabricated and encapsulated using the method described in Example 1. The lamps had the following structure: Glass/ITO/polypyrrole (500 Å)/NPD (500 Å)/(4,4'-Bis(carbazol-9-yl)-biphenyl (CBP) (H.W. Sands Corp, Jupiter, Fla.): 2,3,7,8,12,13,17,18-Octaethyl-21H,23H-porphine platinum (II) (PtOEP) (H.W. Sands Corp, Jupiter, Fla.)) (200 Å)/(Bis-(2-methyl-8-quinolinolato)-4-(phenyl-phenolato)-aluminium-(III) (BalQ) (Eastman Kodak Co., Rochester, N.Y.)) (500 Å)/LiF (17 Å)/Al (2000 Å). The CBP:PtOEP layer was deposited by co-evaporation and the layer contained 6% by weight PtOEP.

Figure 3:
FIG. 3 is a digital photograph of a positive image produced by a method of the present invention.

One device was imaged with the laser system of Example 1 using 7000 mA laser driver current and 1250 rpm scanner speed. The imaging head was 1400 μm above the imaging table. The image source was a bit-mapped image of the 3M logo that was projected through the device anode. A dark "3M" logo image on a red background was produced when current was applied to the device, as shown in FIG. 3.

Figure 4:
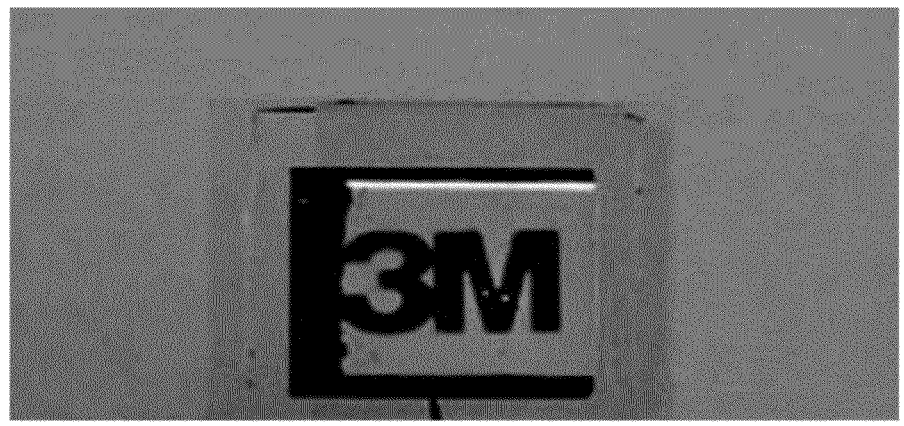
FIG. 4 is a digital photograph of a negative image produced by a method of the present invention.

A second device was imaged under the same conditions except that the bit-mapped image file of the "3M" logo was inverted such that the background of the image area was exposed with the laser and the "3M" image was not exposed. A red "3M" logo on a dark background was observed when the device was driven, as shown in FIG. 4.

This example shows that large image features can be created, that both negative and positive images can be created by manipulating the nature of the image file, and that the process is effective for phosphorescent small molecule OLED devices in addition to fluorescent devices.

Example 3

Encapsulated Light Emitting Polymer Device

Several encapsulated OLEDs were prepared on 22 mm square (0.5-0.6 mm thick) ITO coated glass (15 ohm/square, Colorado Concept Coatings LLC, Longmont, Colo.). The ITO was etched in a manner similar that described in Example 1 to give substrates that had a 22×5 mm ITO cathode pad and a 22×16 mm ITO anode pad separated by a 22×1 mm stripe where the ITO had been etched away. The substrates were cleaned by rubbing with a methanol soaked lint-free cloth (Vectra Alpha 10, Texwipe Co., LLC, Upper Saddle River, N.J.) followed by a 4 min oxygen plasma treatment (full power and 5 psi oxygen, Plasma-Preen 11-973, Plasmatic Systems, Inc., North Brunswick, N.J.). An aqueous solution of polythiophene (1% solids, Baytron P 4083, Bayer, Leverkuesen, Germany) was spin coated onto the cleaned, etched substrates to give a 50 nm film. Polythiophene was removed from the cathode pad by wiping with a moist cotton swab and the coated substrates were dried for 15 minutes on a 110° C. hot plate under a flow of nitrogen. The substrates were transferred to a nitrogen atmosphere glove box where a solution of "Super Yellow" poly(phenylenevinylene) (PPV) (Product No. PD132, Covion, Frankfurt, Germany) in toluene (1% solids) was spin coated at 2500 rpm. The PPV was removed from the cathode pad by wiping with a cotton swab that had been wetted with a small amount of toluene. After the coated substrates were dried for 15 minutes on a 80° C. hot plate, they were transferred to a second glove box that contained a thin film evaporation chamber (Edwards 500, BOC Edwards, England) for the thermal deposition of cathodes. Ca (1,000 Å) and Ag (2,000 Å) were sequentially deposited onto the coated substrates through a metal shadow mask that contained a 12×16 mm rectangular opening disposed such that the cathode pad was partially coated with Ca and Ag and approximately 12×13 mm of the PPV coated area was covered by the cathode. This provided OLEDs with an emissive area of about 1.5 to 1.6 cm$^2$ when connected to a DC power source (about 3 volts and above) via the ITO anode and cathode leads. Rectangular portions (about 20×22 mm) of thermal laminating film were cut from thermal laminating pouches (TDE Systems, Kmart Corp., Troy, Mich.) and these were transferred to the glove box. The laminating film was place adhesive side down onto the cathode side of the OLED devices such that the cathode area was completely covered and approximately 2 mm of the ITO cathode and anode leads were left uncovered. The film-covered OLEDs were placed on a 100° C. hot plate for approximately 15 seconds to partially adhere the film to the cathode side of the devices. The device and partially adhered film were then fed through a 2 roll thermal laminator (Bestech model 2962, Rose Art Industries, Livingston, N.J.) that operated at about 100° C. to provide OLED devices with the cathode area protected from exposure to the atmosphere by the thermal laminating film and adhesive.

One device was removed from the glove box and imaged through the anode with the laser imaging system described in Example 1. The polygon scanning speed was 1500 rpm, laser power was 100% (8000 mA), and the imaging head was 1100 microns above the imaging stage. A bit-mapped graphic image of a light bulb logo was used. After imaging, the light bulb logo could be faintly detected in the PPV layer when viewed from the front (anode side) of the device and in the cathode layer when viewed from the back of the device through the transparent encapsulating film. When a forward bias of 4-6 volts DC was applied to the device via the ITO cathode and anode leads, the electroluminescent image of the light bulb logo was well defined and clearly visible. The electroluminescence in the areas exposed to the laser was considerably brighter than in the unexposed areas.

This example shows that encapsulated light emitting polymer OLEDs can be patterned with an IR laser and that the electroluminescence is enhanced by exposure to the laser.

Example 4

Encapsulated Light Emitting Polymer/Polystyrene Blend Device

An aqueous solution of polythiophene (Baytron P 4083, Bayer, Leverkuesen, Germany) was spin coated onto 22 mm square, approximately 1 mm thick, ITO glass 15 ohm/square, Colorado Concept Coatings LLC, Longmont, Colo.), which were etched as in Example 3 and cleaned as in Example 1, to give a 50 nm film. The substrates were dried for 15 minutes on a 100° C. hot plate under a nitrogen flow. A 1% solids by weight toluene solution containing equal parts by weight of "Super Yellow" poly(phenylenevinylene) (PD 132 from Covion, Frankfurt, Germany) and polystyrene (50,000 MW, Aldrich, Milwaukee, Wis.) was subsequently spin coated onto the polythiophene layer to give PPV/PS film of 80 nm thickness. The coated substrates were placed in a bell jar evaporator (model 306, BOC Edwards, England) and 7 Å of LiF followed by 2000 Å of Al were thermally evaporated through a metal shadow mask of the type used in Example 3. The devices were transferred to a nitrogen glove box and encapsulated as described in Example 1.

One of the devices was imaged through the anode with the laser system of Example 1 using 7000 mA laser power and 1250 rpm scanner speed. The imaging head was 1400 microns above the imaging table. The image source was a bit-mapped image of the "3M" logo. This produced a bright "3M" logo image on a darker background when current was applied to the device. This was the opposite effect as was observed in Example 2 which produced a dark "3M" logo on a bright background when imaged with the same bit-mapped image file.

A second device was imaged through the anode at 8000 mA and 1000 rpm scanner speed using an eagle head graphic image to give a bright eagle head on a darker background. A third device was imaged under the same conditions (as the second device) except that the eagle head image file was the negative image of the file used previously. This produced a darker eagle head image on a bright background. The result was that the electroluminescence of the PPV lamps was enhanced by exposure to the IR laser diode. The unexposed areas showed essentially the same moderately dim electroluminescence before and after the device was imaged.

This example shows that encapsulated light emitting polymer OLEDs may be imaged IR laser light and that the effect is opposite that observed for small molecule OLEDs.

Example 5

Encapsulated Molecularly-Doped Polymer Device

A set of OLEDs on 1 mm thick 22 mm square ITO/glass substrates (15 ohm/square, Colorado Concept Coatings LLC, Longmont, Colo.) was prepared and encapsulated as in Example 4 except that the light emitting polymer (LEP) solution was replaced by a 1% solids dichloroethane solution containing AlQ (36 parts by weight), N,N'-bis(3-methylphenyl)-N,N'-bis(phenyl)benzidine (TPD) (H.W. Sands Corp, Jupiter, Fla.) (17 parts by weight), 1,3,5,7,8-pentamethyl-2,6-diethylpyrromethene difluoroborate (pyrromethene 567, Exciton, Inc., Dayton, Ohio) (3 parts by weight), and polystyrene (50,000 MW, Aldrich) (106 parts by weight).

One device was imaged through the anode with the laser system of Example 1 using 6000 mA laser power and 1750 rpm scanner speed. The imaging head was 1400 µm above the imaging table. The image source was a bit-mapped image of the "3M" logo. This produced a dark "3M" logo image on a green background when current was applied to the device.

A second device was imaged through the anode at 8000 mA and 1000 rpm scanner speed using the negative eagle head bit mapped graphic file wherein the background of the image was exposed with the laser. This produced a bright green eagle head image on a dark background.

This example shows that encapsulated small molecule molecularly doped polymer OLEDs can be imaged in the same manner as evaporated small molecule OLEDs in that the electroluminescence is darkened in the areas exposed by the laser.

Example 6

Encapsulated Small Molecule Fluorescent Models with Conductive Polymer Buffer Layers A series of 22 mm glass cover slips (about 0.15 mm thick, VWR Scientific, West Chester, Pa.) were spin coated with 50 nm of polythiophene (Baytron P 4083), dried at 100° C. under nitrogen for 10 minutes, and placed in a bell jar evaporation chamber. Layers of NPD (300 Å), AlQ (500 Å), and Al (2000 Å) were sequentially vapor deposited to approximate the organic and cathode layers of a functional small molecule vapor deposited OLED. These structures were encapsulated with EpoTek OG142-13 UV epoxy adhesive as described in Example 1 except that 22 mm cover slips were used and the encapsulation was done in air rather than a nitrogen glove box.

Several of these non-functional model devices were imaged through the organic coated cover slip with the laser system of Example 1 using 100% (8000 mA) laser driver current at several different polygon scan speeds. The imaging head was 725 µm above the imaging table. The image source was a bit-mapped image of a series of focus lines of varying width and pitch. At scan speeds from 1500 to 5000 rpm, clear images of the focus lines could be observed when the imaged samples were viewed under a blacklight (365 nm). Under the blacklight, the exposed areas showed the greenish photoluminescence characteristic of AlQ while the unexposed areas showed the bluish photoluminescence characteristic of NPD. Higher scan speeds correspond to lower laser exposure levels and 5000 rpm is essentially the upper limit of the imager used in these studies.

Several other samples were imaged through the organic coated cover slip at 100% (8000 mA) laser driver current and 3500 rpm scanner speed and the height of the imaging head was varied from 625 to 1025 µm above the imaging table. This has the effect of changing the focal point of the laser imager relative to the sample. In all cases, the image of the focus lines was readily observed under blacklights.

This example shows that a wide range of laser powers, including very low power, is effective in imaging an encapsulated OLED structure and that a wide range of focus or "depth of field" is possible. This further shows that in the case of small molecule evaporated OLEDs, laser exposure disturbs the organic heterostructure of the OLED stack.

Example 7

Encapsulated Small Molecule Fluorescent Models with Vapor Deposited Buffer Layer A series of 22 mm glass cover slips (about 0.15 mm thick, VWR Scientific) were placed in a bell jar evaporation chamber. Layers of 4,4',4''-tris(N-(3-methylphenyl)-N-phenylamino)triphenylamine, (MTDATA) (H. W. Sands Corp., Jupiter, Fla.) doped with 7% tetrafluorotetracyanoquinodimethane, (FTCNQ) (Tokyo Kasei Kogyo Co., Tokyo, Japan) (2000 Å), NPD (300 Å), AlQ (500 Å), and Al (2000 Å) were sequentially deposited to approximate the organic and cathode layers of a functional small molecule vapor deposited OLED incorporating an evaporated buffer layer according to the method of X. Zhou, M. Pfeiffer, J. Blochwitz, A. Werner, A. Nollau, T. Fritz, and K. Leo, *Appl. Phys. Lett*., Vol. 78, No. 4, 22 Jan. 2001, pages 410-412). These structures were encapsulated with EpoTek OG142-13 UV epoxy adhesive as described in Example 1 except that 22 mm cover slips were used and the encapsulation was done in air rather than a nitrogen glove box.

Several of these non-functional model devices were imaged through the organic coated front cover slip with the laser system of Example 1 using 100% (8000 mA) laser driver current at several different scan speeds. The imaging head was 825 µm above the imaging table. The image source was a bit-mapped image of a series of focus lines of varying width and pitch. At scan speeds from 1000 to 4500 rpm, clear images of the focus lines could be observed when the imaged samples were viewed under a blacklight (365 nm).

This example shows that highly colored conductive polymer buffer layers like polythiophene and polypyrrole are not required in order to image encapsulated OLED structures with IR laser diodes and that buffers comprising electron donors doped with electron acceptors can be similarly imaged.

Example 8

Encapsulated Small Molecule Fluorescent Models with No Buffer Layer

A series of 22 mm glass cover slips (about 0.15 mm thick, VWR) were placed in a bell jar evaporation chamber. Layers of NPD (300 Å), AlQ (500 Å), and Al (2000 Å) were sequentially deposited to approximate the organic and cathode layers of a functional small molecule vapor deposited OLED with no planarizing buffer layer. These structures were encapsulated with EpoTek OG142-13 UV epoxy adhesive as described in Example 1 except that 22 mm cover slips were used and the encapsulation was done in air rather than a nitrogen glove box.

Several of these non-functional model devices were imaged through the organic coated cover slip with the laser system of Example 1 using 100% (8000 mA) laser driver current at several different polygon scan speeds. The imaging head was 825 µm above the imaging table. The image source was a bit-mapped image of a series of focus lines of varying width and pitch. At scan speeds from 1000 to 4500 rpm, clear images of the focus lines could be observed when the imaged samples were viewed under a blacklight (365 nm).

This example shows that buffer layers are not required in order to image encapsulated OLED structures with IR laser diodes.

Example 9

Encapsulated PET/ITO Devices

A 70-100 ohm/square layer of ITO was sputtered onto a polyethylene terephthalate (PET) (TEIJIN TETORON HSPE400, DuPont Tejin Films, Wilmington, Del.) web using a planar magnetron cathode to create a roll of flexible OLED substrate. The sputter target was 90% $In_2O_3$ and 10% $SnO_2$ and the vacuum coating system had a base pressure of about $5\times10^{-7}$ Torr. The gas flow rates for argon and oxygen were 50 sccm and 2.0 sccm, respectively, and the total pressure was maintained at 1.00 mTorr. The target power was 1.00 kW with a voltage of around 420V. Substrate roll speeds were adjusted to produce an ITO coating about 70 nm thick. A 2×10 inch piece of SCOTCH Brand solder plating tape (Product No. 1280, 3M Company) was laminated down the center of a 6.5×10 inch portion of the ITO/PET film. Two 2×10 inch pieces of SCOTCH Brand solder plating tape (Product No. 1280, 3M Company) were laminated on either side of the first piece of tape such that there was a 1 mm gap between the center tape and the tape disposed on either side of the center tape. The plating tape masked PET/ITO film was then exposed to the vapors above a concentrated $HCl/FeCl_3$ etching bath (3.2 g $FeCl_3$ in 100 mL concentrated HCl) for approximately 5 minutes to etch away the ITO in the 1 mm gaps. The etched film was washed with distilled water and the plating tape was peeled away to give a PET/ITO film with two parallel ITO-free 1 mm stripes. Using scissors, this film was cut into several 22 mm square pieces that had a 22×5 mm ITO cathode pad and a 22×16 mm ITO anode pad separated by a 22×1 mm stripe where the ITO had been etched away. The etched substrates were rinsed with acetone to remove any adhesive residue from the plating tape. They were further cleaned in an oxygen plasma (4 minutes at 50 watts and 200 millitorr oxygen) in a plasma chamber (Micro-RIE Series 80, Technics, Inc., Dublin, Calif.). An aqueous solution of polythiophene (Baytron P 4083, Bayer, Leverkuesen, Germany) was spin coated onto the 22 mm square plastic substrates at 2500 rpm for 40 seconds. The plastic substrates were adhered to the spin coating chuck by placing a 1 mm thick 22 mm square piece of glass onto the spin coater vacuum chuck, applying vacuum to hold the glass in place, placing a drop of methanol onto the glass piece, and placing the plastic substrate onto the methanol coated glass. The surface tension of the methanol layer between the glass and plastic was sufficient to adhere the plastic to the glass during the spin coating. After spin coating the plastic was peeled away from the glass piece. Polythiophene was removed from the cathode pad by rubbing with a moistened cotton swab. The substrates were dried on an 80° C. hot plate under a nitrogen flow for 20 minutes. The substrates were then placed in a bell jar evaporation chamber which was evacuated to about $10^{-6}$ torr, then 2000 Å of MTDATA doped with 7% FTCNQ was thermally deposited as an additional hole transporting buffer layer on top of the spin coated polythiophene layer. This was followed by thermal evaporation of NPD (300 Å), AlQ doped with 1% C545T (300 Å), and AlQ (200 Å). The organic layers were deposited through a metal shadow mask containing a 14×15 mm opening disposed such that a 14×14 mm portion of the anode pad and a corresponding portion of the 1 mm ITO free area separating the anode and cathode pads could be covered by the organic materials with very little, if any, organic deposits forming on the cathode pad. The organic coated substrates were transferred to glove box that contained a thin film evaporation chamber (Edwards 500, BOC Edwards, England) for the thermal deposition of cathodes. Lithium fluoride (7 Å), aluminum (500 Å), and silver (1,500 Å) were sequentially deposited at about $10^{-7}$ torr onto the organic coated substrates through a metal shadow mask that contained a 12×16 mm rectangular opening disposed such that the cathode pad is partially coated with Ca and Ag and approximately 12×13 mm of the 14×14 mm organic vapor coated area was covered by the cathode. Since the vapor deposited organic layers extended beyond the cathode area, short circuits at the edge of the cathode area are avoided. This provided OLEDs with an emissive area of about 1.5 to 1.6 $cm^2$ when connected to a DC power source.

Several 60×40 mm sheets of laminating film were cut from thermal laminating pouches (TDE Systems, Kmart Corp., Troy, Mich.). These were folded in half to form 30×40 mm pouches with the adhesive coated surfaces facing each other on the interior of the pouch and the pouches were transferred into the glove box. The devices were encapsulated by placing them in the 30×40 mm pouches such that all but approximately 2 to 4 mm of the bottom edge, which contained the cathode and anode leads, was covered by the pouch. The pouches containing the devices were then placed on a 100° C. hot plate for about 10 seconds to partially adhere the devices in the pouches. The pouches were then passed through a 2 roll thermal laminator (Bestech model 2962, Rose Art Industries, Livingston, N.J.) that operates at about 100° C. to provide OLED devices with the cathode area protected from exposure to the atmosphere by the thermal laminating film and adhesive and ITO cathode and anode leads that extend beyond the encapsulated area.

One of the encapsulated devices was removed from the glove box and imaged with the laser imaging system described in Example 1 through the anode of the device. The polygon scanning speed was 4000 rpm, laser power was 100% (8000 mA) laser driver current, and the imaging head was 825 μm above the imaging stage. The image source was a bit-mapped image of a series of focus lines of varying width and pitch. After imaging, the focus line pattern could be faintly detected in the OLED layers when viewed from the front (anode side) of the device and in the cathode layer when viewed from the back of the device through the transparent encapsulating film. When a forward bias of 4-6 volts DC was applied to the device via the ITO cathode and anode leads, an electroluminescent image of the negative of focus line pattern was well defined and clearly visible. Bright green electroluminescence was seen in the areas not exposed to the laser while the exposed areas showed little or no electroluminescence.

A second device was removed from the glove box and imaged at a polygon scan speed of 4000 rpm and 80% laser power with the imaging head 825 μm above the imaging stage. The device was exposed to the laser through the anode and the same focus line pattern was used as for the first device. After imaging, the focus line pattern could be faintly detected in the OLED layers when viewed from the front (anode side) of the device and in the cathode layer when viewed from the back of the device through the transparent encapsulating film. When a forward bias of 4-6 volts DC was applied to the device via the ITO cathode and anode leads, an electroluminescent image of the negative of focus line pattern was well defined and clearly visible. Bright green electroluminescence was seen in the areas not exposed to the laser while the exposed areas showed little or no electroluminescence.

This example shows that encapsulated flexible plastic OLED devices may be patterned with an IR laser diode and that low laser powers are effective.

Example 10

Encapsulated PET/ITO/Ag/ITO Devices

A 20 ohm/square multilayer of ITO/Ag/ITO was sputtered in a three-step process in a vacuum system with a base pressure of about $5\times10^{-7}$ Torr onto a PET (TEIJIN TETORON HSPE400, DuPont Tejin Films, Wilmington, Del.) web to create a roll of flexible OLED substrate. The first layer consisted of ITO, sputtered using a planar magnetron cathode with a target composed of 90% $In_2O_3$ and 10% $SnO_2$. The gas flow rates for argon and oxygen were 50 standard cubic centimeters (sccm) and 2.0 sccm, respectively, and the total pressure was maintained at 1.00 mTorr. Target power was 1.00 kW with a voltage of around 420V. Substrate roll speeds were adjusted to produce a film about 40 nm thick. The second layer consisted of Ag, sputtered using a planar magnetron cathode with a target composed of high purity Ag. The gas flow rate for argon was 50 sccm and the total pressure was maintained at 1.00 mTorr. Target power was 1.00 kW with a voltage of around 570V. Substrate roll speeds were adjusted to produce a film about 10-20 nm thick. The third layer consisted of ITO, sputtered in an identical fashion to the first ITO layer. Several encapsulated OLED devices were prepared on the PET/ITO/Ag/ITO substrates in a manner identical to that described in Example 9.

One device was removed from the glove box and imaged at a polygon scan speed of 4000 rpm and 80% (6400 mA) laser driver current with the imaging head 825 μm above the imaging stage. The device was exposed to the laser through the anode using the same focus line pattern as in Example 9. After imaging, the focus line pattern could be faintly detected in the OLED layers when viewed from the front (anode side) of the device and in the cathode layer when viewed from the back of the device through the transparent encapsulating film. When a forward bias of 4-6 volts DC was applied to the device via the ITO cathode and anode leads, an electroluminescent image of the negative of focus line pattern was well defined and clearly visible. Bright green electroluminescence was seen in the areas not exposed to the laser while the exposed areas showed little or no electroluminescence.

A second device was removed from the glove box and imaged at a polygon scan speed of 4000 rpm and 65% (5200 mA) laser driver current with the imaging head was 825 μm above the imaging stage. The device was exposed to the laser through the anode and the same focus line pattern was used. After imaging, the focus line pattern could be faintly detected in the OLED layers when viewed from the front (anode side) of the device and in the cathode layer when viewed from the back of the device through the transparent encapsulating film. When a forward bias of 4-6 volts DC was applied to the device via the ITO cathode and anode leads, an electroluminescent image of the negative of focus line pattern was clearly visible. Bright green electroluminescence was seen in the areas not exposed to the laser while the exposed areas showed greatly reduced electroluminescence. At lower voltages, it was difficult to detect the electroluminescence in the imaged areas while at higher voltages the electroluminescence in the imaged areas was more readily apparent. This experiment shows that encapsulated flexible OLEDs can be imaged with an IR laser diode even when IR absorbing layers, such as silver metal, are disposed between the laser and the OLED layers.

This example further shows that some level of grayscale imaging is possible by adjusting the laser power delivered to the device.

Example 11

Back Side (Cathode) Treatment of Encapsulated Devices

Several of the 0.5 mm thick 22 mm square ITO substrates (15 ohm/square, Colorado Concept Coatings LLC, Longmont, Colo.) were etched, cleaned, coated with aqueous polythiophene, and dried as described in Example 3. The substrates were then placed in a bell jar evaporation chamber which was evacuated to about $10^{-6}$ torr and 2000 Å of MTDATA doped with 7% FTCNQ was vapor deposited as an additional hole transporting buffer layer on top of the spin coated polythiophene layer. This was followed by vapor deposition of NPD (300 Å), AlQ doped with 1% C545T (300 Å), and AlQ (200 Å). The organic layers were deposited through a metal shadow mask containing a 14×15 mm opening disposed such that a 14×14 mm portion of the anode pad and a corresponding portion of the 1 mm ITO-free area separating the anode and cathode pads was covered by the organic materials with very little, if any, organic deposits forming on the anode pad. The organic coated substrates were removed from the bell jar chamber, the shadow masks with the 14×15 mm opening were replaced with metal shadow masks that contained a 12×16 mm rectangular opening, the substrates were returned to the bell jar chamber, and the system was evacuated to about $10^{-6}$ torr. Cathodes consisting of LiF (7 Å) covered by Al (2500 Å) were vapor deposited through the metal shadow masks. These cathode shadow masks were disposed such that the cathode pad was partially coated with LiF and Al and approximately 12×13 mm of the 14×14 mm organic vapor coated area was covered by the cathode. Since the vapor deposited organic layers extended beyond the cathode area, short circuits at the edge of the cathode area were avoided. This provided OLEDs with an emissive area of about 1.5 to 1.6 $cm^2$ when connected to a DC power source. The devices were removed from the bell jar chamber and were immediately encapsulated with 18 mm glass cover slips as described in Example 1 except that the encapsulation was carried out in air rather than in a nitrogen glove box.

One such device was imaged with the laser system described in Example 1. The laser was used to irradiate the metal cathode through the encapsulating lid and adhesive rather than irradiating the organic layers through the anode as described in the previous examples. Laser driver current was 100% (8000 mA), the polygon scan speed was 3500 rpm, the imaging head was 825 μm above the imaging stage, and the focus line pattern was used as the image file. After exposure, a faint image of the focus lines could be seen in the cathode when viewed through the encapsulating cover slip and in the organic layers when viewed through the anode. When a forward bias of 4-6 volts DC was applied to the device via the ITO cathode and anode leads, an electroluminescent image of the negative of focus line pattern was clearly visible. Bright green electroluminescence was seen in the areas not exposed to the laser while no electroluminescence was observed by eye in the exposed regions. Since the device was imaged from the back, the imaged formed was the mirror image of those formed from the front (anode side) side exposure such as that described in Example 9.

One of the non-functioning model devices lacking a planarizing buffer from Example 8 was imaged at 100% (8000 mA) laser driver current and a polygon scan speed of 3500 rpm. The imaging head was 825 μm above the imaging stage, and the focus line pattern was used as the image file. The laser was projected onto the Al cathode layer through the encapsulating cover slip and adhesive. After exposure, an image of the focus lines could be seen in the Al layer when viewed through the encapsulating cover slip and in the organic layers when viewed through the front of the model device. Under blacklights (365 nm) a well resolved image of the focus lines was evident in the organic layers when viewed from the front (anode side) of the device with the exposed areas showing the greenish photoluminescence characteristic of AlQ and the unexposed areas showing the bluish photoluminescence characteristic of NPD.

One of the devices prepared in Example 3 was imaged at 100% (8000 mA) laser driver current and a polygon scan speed of 1250 rpm. The imaging head was 1575 μm above the imaging stage, and the light bulb logo pattern was used as the image file. The laser was projected onto the Ca/Ag cathode layer through the encapsulating laminating film and adhesive. After exposure, an image of the light bulb logo could be seen in the cathode layer when viewed through the encapsulating film and in the LEP layer when viewed through the anode of the device. When a forward bias of 4-6 volts DC was applied to the device via the ITO cathode and anode leads, the electroluminescent image of the light bulb logo was well defined and clearly visible. The electroluminescence in the areas exposed to the laser was considerably brighter than in the unexposed areas yielding a positive image of the light bulb logo.

One of the devices prepared in Example 9 was imaged at 100% (8000 mA) laser driver current and a polygon scan speed of 4000 rpm. The imaging head was 825 μm above the imaging stage, and the focus line pattern was used as the image file. The laser was projected onto the Al cathode layer through the encapsulating laminating film and adhesive. After exposure, no image could be detected in the device by visual inspection or by electroluminescence. The exposure was repeated at polygon scan speeds of 2000 and then 1000 rpm to increase the laser power delivered to the device. In both cases, no images could be detected and the entire area of the device showed uniform electroluminescence. The cathode for this device was prepared in an essentially oxygen and moisture free nitrogen atmosphere in a glove box and the device was encapsulated in the same glove box without any exposure to air. This produced a cathode essentially free of surface oxidation that displayed a high degree of reflectivity. The lack of image formation could be ascribed to reflection of the laser beam from the very mirror-like cathode surface.

This example shows that encapsulated OLEDs can be imaged with IR laser diodes by exposing the cathode to the laser through the encapsulating structure and that the reflectivity of the cathode is important in the efficacy of the cathode side laser imaging process.

Example 12

Treatment Through Touch Screen

A non-functioning model device lacking a planarizing buffer from Example 8 was placed on the laser imaging stage with the organic layers facing up and was covered by a pressure sensitive transparent touch screen panel (MicroTouch, 3M Company). The touch screen covered device was imaged at 100% (8000 mA) laser driver current and a polygon scan speed of 3500 rpm. The imaging head was 825 μm above the imaging stage, and the focus line pattern was used as the image file. After laser exposure, a faint image of the focus line pattern could be visually detected in the organic layers and in the Al layer. Under blacklights (365 nm) a well resolved image of the focus lines was evident in the organic layers when viewed from the front (anode side) of the device with the exposed areas showing the greenish photoluminescence characteristic of AlQ and the unexposed areas showing the bluish photoluminescence of characteristic of NPD. No change in the functionality (that is, switch response) of the touch screen was observed in the areas exposed to the laser and no image could be detected in the touch screen panel.

One of the OLED devices prepared in Example 13 was placed on the laser imaging stage with the anode side facing up and was covered by pressure sensitive transparent touch screen panel (MicroTouch, 3M Company). The touch screen covered device was imaged at 100% (800 mA) laser driver current and a polygon scan speed of 3500 rpm. The imaging head was 825 μm above the imaging stage, and the focus line pattern was used as the image file. After laser exposure, a very faint image of the focus line pattern could be visually detected in the organic layers and in the cathode. When a forward bias of 4-6 volts DC was applied to the device via the ITO cathode and anode leads, an electroluminescent image of the negative of focus line pattern was clearly visible. Bright green electroluminescence was seen in the areas not exposed to the laser while no electroluminescence was observed by eye in the exposed regions. No change in the functionality of the touch screen was observed in the areas exposed to the laser and no image could be detected in the touch screen panel.

This example shows that OLED devices can be imaged through touch screen panels. Thus an encapsulated, unpatterned OLED device could be laminated to a touch screen panel to create a customizable touch screen assembly. The various areas of the touch screen would be programmed for the desired response when depressed and different logos corresponding to the functions of the different areas of the touch screen would be "written" into the OLED using the IR laser diode imaging of this invention. The result would be a self-emissive touch screen panel.

Example 13

Treatment Through Laser Ablatable ITO

A sample of an ITO coated flexible transparent conductor film, described in U.S. Pat. No. 6,379,509, especially at col. 6, lie 58 to col. 7, line 27, which portion is incorporated by reference, designed such that the ITO coating could be laser ablated (3M Company, 3M Optical Systems, Waltham, Mass.) was imaged with the laser system of Example 1 using 100% (8000 mA) laser driver current and 1000 rpm polygon scan speed. The imaging head was 750 μm above the imaging table. The image source was the focus line pattern. The ITO coated side of the conductor film was facing upwards on the imaging table. After laser exposure, the focus lines were clearly visible in the conductor film as a tan image. A different area of the conductive film was then imaged under the same conditions except that a rectangular block image was used instead of the focus lines. After laser exposure, the rectangular block was clearly visible in the conductor film as a tan image. When tested with an ohmmeter, the tan block pattern was not conductive while the surrounding areas retained their original conductivity. The tan image could be at least partially removed by rubbing with cotton swab and these areas remained nonconductive. Thus it appeared that the laser ablatable ITO film was not being cleanly ablated by the IR laser diode imager but was being sufficiently disrupted to create non-conductive patterns in the exposed areas.

A non-functioning model device lacking a planarizing buffer from Example 8 was placed on the laser imaging stage with the organic layers facing up and was covered by an 8×10 inch sheet of the laser ablatable ITO coated flexible transparent conductor film with the ITO facing up. The transparent conductor covered model device was imaged at 100% (8000 Ma) laser driver current and a polygon scan speed of 1000 rpm. The imaging head was 750 μm above the imaging stage and the focus line pattern was used as the image file. After laser exposure, a very faint image of the focus line pattern could be visually detected in the organic layers and in the Al layer of the model device. Under blacklights (365 nm) a well resolved image of the focus lines was evident in the organic layers when viewed from the front (anode side) of the device with the exposed areas showing the greenish photoluminescence characteristic of AlQ and the unexposed areas showing the bluish photoluminescence of characteristic of NPD. No image formed in the area of the transparent conductor film that was over the model device, but a clear tan image formed in the transparent conductor that was outside of the 22 mm square area of the model device. In the area of the model device, the transparent conductor appeared to be above the focal plane of the laser and thus no image was formed. In the area surrounding the model device, the transparent conductor was in contact with the imaging stage thereby placing it within the focus of the laser, which allowed an image to form.

This example shows that such absorptive materials can be interposed between an OLED and the laser system and that the OLED can still be laser imaged without image formation in the absorptive film. This demonstrates the importance of laser focus in the IR laser diode imaging process. If the laser focus is out of the focal plane, imaging can be done through the focal plane without effecting the focal plane.

Various modifications and alterations of this invention will become apparent to those skilled in the art without departing from the scope and spirit of this invention and it should be understood that this invention is not to be unduly limited to the illustrative embodiments set forth herein.

The invention claimed is:

1. A method for laser patterning encapsulated organic light emitting diodes comprising:
   providing an encapsulated organic light emitting diode having a light emitting layer and an intervening layer, and
   treating one or more areas of the light emitting layer with a laser beam, which laser beam energy is transmitted through an electrode layer,
   wherein the intervening layer comprises a layer between a source of the laser beam and the light emitting layer, and
   wherein the intervening layer is within the encapsulated organic light emitting diode,
   wherein the energy level of the laser beam is below the ablation threshold of the light emitting layer and the intervening layer,
   wherein the laser beam is transmitted through the intervening layer to treat the one or more areas, and
   wherein the light emission of the one or more areas of the light emitting layer treated with the laser beam are permanently changed.

2. The method of claim 1 wherein the electrode is an anode.

3. The method of claim 2 wherein the anode is transparent.

4. The method of claim 1 wherein the light emitting layer comprises a light emitting polymer.

5. The method of claim 4 wherein the light output of the treated areas of the polymeric layer have an increased light emission.

6. The method of claim 1 wherein the light emitting layer comprises a small molecule material.

7. The method of claim 6 wherein the light output of the treated area of the small molecule layer has a decreased light emission.

8. The method of claim 1 wherein the light emitting layer comprises a molecularly-doped polymer.

9. The method of claim 8 wherein the light output of the treated area of the molecularly-doped polymer layer has a decreased light emission.

10. The method of claim 1 wherein the encapsulated organic light emitting diode has discrete pixels and wherein individual pixels are treated.

11. The method of claim 10 wherein individual pixels are treated to adjust the uniformity of emissivity across the display.

12. The method of claim 11 wherein the emission color of individual pixels is changed by the treatment.

13. The method of claim 12 wherein the treated pixels contain dyes that change color upon irradiation.

14. The method of claim 1 wherein the encapsulated organic light emitting diode is treated to adjust brightness.

15. The method of claim 1 wherein the light emitting layer comprises sublayers and two or more sublayers are treated such that the sublayers have the same or different patterned images.

16. The method of claim 1 wherein the electrode is a cathode.

17. The method of claim 1 wherein the intervening layer comprises a substrate.

18. The method of claim 17 wherein the treatment of the one or more areas does not cause ablation of the substrate.

19. The method of claim 1 wherein the intervening layer comprises an absorptive material.

* * * * *